(12) United States Patent
Schat (10) Patent No.: US 11,522,551 B2
(45) Date of Patent: Dec. 6, 2022

(54) PLL JITTER DETECTION (71) Applicant: NXP B.V., Eindhoven (NL)

(72) Inventor: Jan-Peter Schat, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/450,190

(22) Filed: Oct. 7, 2021

(65) Prior Publication Data

US 2022/0158644 A1    May 19, 2022

(30) Foreign Application Priority Data

Nov. 18, 2020   (EP) .................................... 20208427

(51) Int. Cl.
*H03L 7/093* (2006.01)
*H03L 7/099* (2006.01)

(52) U.S. Cl.
CPC .............. *H03L 7/093* (2013.01); *H03L 7/099* (2013.01)

(58) Field of Classification Search
CPC ................................ H03L 7/093; H03L 7/099
See application file for complete search history.

(56) References Cited

U.S. PATENT DOCUMENTS

| | | | | |
|---|---|---|---|---|
| 5,373,255 A * | 12/1994 | Bray | ........................ | H03L 7/089 331/25 |
| 5,811,998 A * | 9/1998 | Lundberg | ................ | H03L 7/087 375/376 |
| 6,973,150 B1 * | 12/2005 | Thuringer | ............... | H03L 7/095 375/376 |
| 8,634,511 B2 * | 1/2014 | Hong | ...................... | H03L 7/113 327/146 |
| 8,829,985 B2 | 9/2014 | Niitsu et al. | | |
| 9,209,960 B1 * | 12/2015 | Leung | .................. | H04L 7/0025 |
| 10,491,365 B1 * | 11/2019 | Lin | ........................ | H04L 43/028 |

(Continued)

FOREIGN PATENT DOCUMENTS

| | | | | |
|---|---|---|---|---|
| CN | 104753527 A | * | 7/2015 | ........... G01R 25/005 |
| CN | 110954878 A | * | 4/2020 | ........... G01S 7/4004 |

(Continued)

OTHER PUBLICATIONS

Abas, A.M., "A Time Difference Amplifier", Electronics Letters, vol. 38, Issue: 23, Nov. 7, 2002.

(Continued)

*Primary Examiner* — Adam D Houston (57) ABSTRACT

The disclosure relates to detecting jitter in phase locked loop (PLL) circuits. Embodiments disclosed include a phase-locked loop, PLL (500) comprising: a phase comparison module (201); a loop filter (102); a voltage controller oscillator, VCO (103); a feedback divider (104); and a jitter evaluation module (502), the phase comparison module (201) comprising a phase comparator (202) and a measurement module (204) configured to detect a metastable output in the phase comparator (202) over active clock cycles of application and feedback clock signals (105, 106) input to the phase comparison module (201) and provide an output signal (208) to the jitter evaluation module (502) indicating a metastability resolution time for the phase comparator (202), the jitter evaluation module (210) being configured to provide an output indicative of jitter based on the metastability resolution time.

20 Claims, 3 Drawing Sheets

(56) References Cited

U.S. PATENT DOCUMENTS

| | | | |
|---|---|---|---|
| 10,868,551 B1* | 12/2020 | Schat | H03L 7/0992 |
| 11,251,796 B2* | 2/2022 | Takai | G11C 7/222 |
| 2006/0082402 A1* | 4/2006 | Knotts | H03L 7/087 |
| | | | 327/156 |
| 2006/0103566 A1* | 5/2006 | Vemulapalli | G04F 10/005 |
| | | | 341/155 |
| 2006/0197611 A1* | 9/2006 | Yan | H03L 7/193 |
| | | | 331/16 |
| 2007/0164800 A1* | 7/2007 | Josephson | H03L 7/0814 |
| | | | 327/158 |
| 2009/0153377 A1* | 6/2009 | Chang | H03L 7/085 |
| | | | 341/53 |
| 2011/0057692 A1* | 3/2011 | Farwell | H03K 19/0033 |
| | | | 327/155 |
| 2013/0002317 A1* | 1/2013 | Frantzeskakis | H03L 7/08 |
| | | | 327/156 |
| 2013/0113528 A1* | 5/2013 | Frantzeskakis | H03L 7/104 |
| | | | 327/117 |
| 2015/0077279 A1* | 3/2015 | Song | G04F 10/005 |
| | | | 341/155 |
| 2015/0137864 A1* | 5/2015 | Whatmough | H03K 5/135 |
| | | | 327/160 |
| 2020/0313678 A1* | 10/2020 | Takai | G11C 7/222 |
| 2022/0158644 A1* | 5/2022 | Schat | H03L 7/093 |

FOREIGN PATENT DOCUMENTS

| | | | | |
|---|---|---|---|---|
| CN | 112332835 A | * | 2/2021 | H03L 7/0805 |
| EP | 2237421 A1 | * | 10/2010 | H03L 7/07 |
| JP | 2021184549 A | * | 12/2021 | |
| JP | 7031936 B2 | * | 3/2022 | |
| KR | 102377473 B1 | * | 3/2022 | |
| WO | 0169328 A2 | | 9/2001 | |
| WO | WO-2017108193 A1 | * | 6/2017 | G04F 10/005 |

OTHER PUBLICATIONS

Asquini, A., "PFD Output Monitoring for RF PLL BIST", 2008 IEEE 14th International Mixed-Signals, Sensors and Systems Test Workshop, Jun. 18-20, 2008.

Bhushan, M., "CMOS Latch Metastability Characterization at the 65-nm-Technology Node", 2008 IEEE Conference on Microelectronic Test Structures, Mar. 24-27, 2008.

Ginosar, R., "Metastability and Synchronizers: A Tutorial", Copublished by the IEEE CS and the IEEE CASS, Sep./Oct. 2011.

Jones, I., "Synchronizer Behavior and Analysis", 2009 15th IEEE Symposium on Asynchronous Circuits and Systems, May 17-20, 2009.

Kinniment, D.J., "Design of an On-Chip Random Number Generator using Metastability", Proceedings of the 28th European Solid-State Circuits Conference, Sep. 24-26, 2002.

Lamport, L., "Buridan's Principle", Foundations of Physics, Oct. 31, 1984; revised: Feb. 24, 2012.

Marchand, C., "Design and characterization of the TERO-PUF on SRAM FPGAs", 2016 IEEE Computer Society Annual Symposium on VLSI, Jul. 11-13, 2016.

Philips Electronics North America Corporation, "A Metastability Primer", Document order No. 9397 750-05226, Nov. 15, 1989.

Minhad, K., "Investigating Phase Detectors", IEEE Microwave Magazine, Digital Object Identifier 10.1109/MMM.2015.2478084, Date of publication: Nov. 13, 2015.

Perott, M., "Tutorial on Digital Phase-Locked Loops", CICC 2009, Sep. 2009.

Reyneri, L., "Oscillatory Metastability in Homogeneous and Inhomogeneous Flip-Flops", IEEE Journal of Solid-State Circuits, vol. 25, No. 1, Feb. 1990.

Suresh, V., "Fine Grained Wearout Sensing using Metastability Resolution Time", Fifteenth International Symposium on Quality Electronic Design, Mar. 3-5, 2014.

Tarawneh, G., "Solutions and Application Areas of Flip-Flop Metastability", PhD Thesis, Newcastle University, UK, School of Electrical and Electronic Engineering, Aug. 2013.

Tarawneh, G., "Intra-chip physical parameter sensor for FPGAS using flip-flop metastability", 22nd International Conference on Field Programmable Logic and Applications, Aug. 29-31, 2012.

Tasca, D., Low-Power Divider Retiming in a 3-4 GHz Fractional-N PLL, IEEE Transactions on Circuits and Systems—II: Express Briefs, vol. 58, Np. 4, Apr. 2011.

* cited by examiner

PLL JITTER DETECTION

CROSS-REFERENCE TO RELATED APPLICATIONS

This application claims the priority under 35 U.S.C. § 119 of European Patent application no. 20208427.3, filed on 18 Nov. 2020, the contents of which are incorporated by reference herein.

FIELD

The disclosure relates to detecting jitter in phase locked loop (PLL) circuits.

BACKGROUND

Jitter in the output clock signal of PLLs is critical for the data integrity of an integrated circuit (IC). Excessive jitter can compromise data transmission to and from an IC, cause internal failures and jeopardize safety-critical functions. For smaller processes, excessive PLL jitter spikes are mainly due to single event upsets (SEU), which may be caused by cosmic radiation. Other potential contributors to jitter include ground bounce and power rail spikes, as well as cross-talk and external electromagnetic interference. All these effects are hard to predict, and an IC's sensitivity to them strongly depends on factors such as the application mode, aging, process corner, supply voltage and temperature. In many cases, safety requirements can only be met when safety-critical parameters are continuously supervised in the field. In the worst case, data corruption caused by jitter may be large enough to jeopardize safety, but still small enough to escape immediate detection.

Automotive standards such as ISO 26262, relating to functional safety of road vehicles, require detection of faults, as can be caused e.g. by excessive jitter in real-time to enable a defined Failure in Time (FIT) limit to be maintained, defined as the number of safety-critical failures per $10^9$ operating hours. The defined FIT for a particular application may typically be around 100 or even as low as 10 for some applications. The FIT may apply to an entire system, resulting in an even tighter requirement for multiple circuits making up a complete system. These standards require proof of a sufficient diagnostic coverage for SEUs. This means that excessive jitter needs to be detected irrespective of data corruption or other faults visible in other parts of the IC. A problem therefore exists of how to detect jitter in a PLL, particularly where this may arise in the form of jitter spikes during operation. This is particularly applicable to safety critical applications such as in automotive applications but may also apply in other applications where detection of jitter is important. A solution to this problem should ideally be usable in addition to existing mechanisms of PLL performance monitoring or may be used as a stand-alone detection mechanism.

SUMMARY

According to a first aspect there is provided a PLL circuit comprising:
 a phase comparison module;
 a loop filter;
 a voltage controller oscillator, VCO;
 a feedback divider; and
 a jitter evaluation module, wherein the phase comparison module is configured to receive an application clock signal and a feedback clock signal, the loop filter is configured to receive an output signal from the phase comparison module, the VCO is configured to receive an output signal from the loop filter and provide the output clock signal, and the feedback divider is configured to receive the output clock signal and provide the feedback clock signal to the phase comparison module, wherein the phase comparison module comprises a phase comparator and a measurement module configured to detect a metastable output in the phase comparator over active clock cycles of the application and feedback clock signals and provide an output signal to the jitter evaluation module indicating a metastability resolution time for the phase comparator, the jitter evaluation module being configured to provide an output indicative of jitter based on the metastability resolution time.

The phase comparator may be a flip-flop configured to receive the application and feedback clock signals, and the phase comparison module may comprise a synchronizer configured to receive an output signal from the flip-flop and provide the output signal from the phase comparison module, the measurement module configured to detect a metastable output in the output signal from the flip-flop.

The measurement module may be configured to detect oscillations in the output signal from the flip-flop over active clock cycles of the application and feedback clock signals.

The measurement module may be configured to count a number of oscillations in the output signal from the flip-flop over active clock cycles of the application and feedback clock signals.

The measurement module may be configured to detect a propagation delay time in the output signal from the flip-flop over active clock cycles of the application and feedback clock signals.

The phase comparator may be a time-to-digital converter, TDC, configured to receive the application and feedback clock signals, the phase comparison module comprising a synchronizer configured to receive an output signal from the TDC and provide the output signal from the phase comparison module, the measurement module configured to detect a metastable output in the output signal from the TDC.

The PLL may be a $2^{nd}$ or higher order PLL.

The feedback divider may be configured to operate as an integer divider. In other arrangements the feedback divider may be configured to operate as a fractional-N divider when the PLL is operating in a first operational mode and as an integer divider when the PLL is operating in a second test mode.

According to a second aspect there is provided a method of detecting jitter in an output clock signal of a phase-locked loop, PLL comprising a phase comparison module, a loop filter, a voltage controller oscillator, VCO and a feedback divider, wherein the phase comparison module receives an application clock signal and a feedback clock signal, the loop filter receives an output signal from the phase comparison module, the VCO receives an output signal from the loop filter and provides the output clock signal, and the feedback divider receives the output clock signal and provides the feedback clock signal to the phase comparison module, the method comprising detecting a metastable output in a phase comparator of the phase comparison module over active clock cycles of the application and feedback clock signals and providing an output signal indicating a metastability resolution time for the phase comparator.

The phase comparator may be a flip-flop that receives the application and feedback clock signals and a synchronizer may receive an output signal from the flip-flop, the synchronizer providing the output signal from the phase comparison module, wherein the measurement module detects a metastable output in the output signal from the flip-flop.

The measurement module may detect oscillations in the output signal from the flip-flop over active clock cycles of the application and feedback clock signals.

The measurement module may count a number of oscillations in the output signal from the flip-flop over active clock cycles of the application and feedback clock signals.

The measurement module may detect a propagation delay time in the output signal from the flip-flop over active clock cycles of the application and feedback clock signals.

The phase comparator may be a time-to-digital converter, TDC, that receives the application and feedback clock signals, a synchronizer receiving an output signal from the TDC and providing the output signal from the phase comparator, the measurement module detects a metastable output in the output signal from the TDC.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments.

DETAILED DESCRIPTION OF EMBODIMENTS

Figure 1:
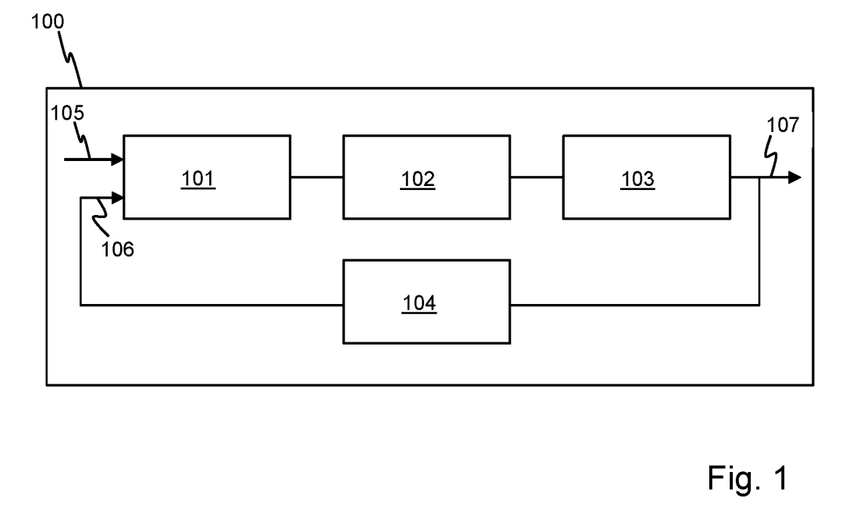
FIG. 1 is a schematic diagram of a conventional PLL.

A conventional PLL is illustrated in FIG. 1. The PLL 100 comprises a phase comparison module 101, a loop filter 102, a voltage-controlled oscillator (VCO) 103 and a feedback clock divider 104. The phase comparison module 101 receives two clock signals 105, 106: a first clock signal 105 from an application and a second clock signal 106 from the output 107 of the PLL via the feedback divider 104. An output of the phase comparison module 101 is provided to the loop filter 102 and an output of the loop filter 102 is provided to the VCO 103, which provides the output clock signal 107. Any difference in phase between the input clock signal 105 and the feedback clock signal 106 is used by the loop filter 102 to adjust the signal provided to the VCO 103 so as to stabilise the output clock signal 107.

Figure 2:
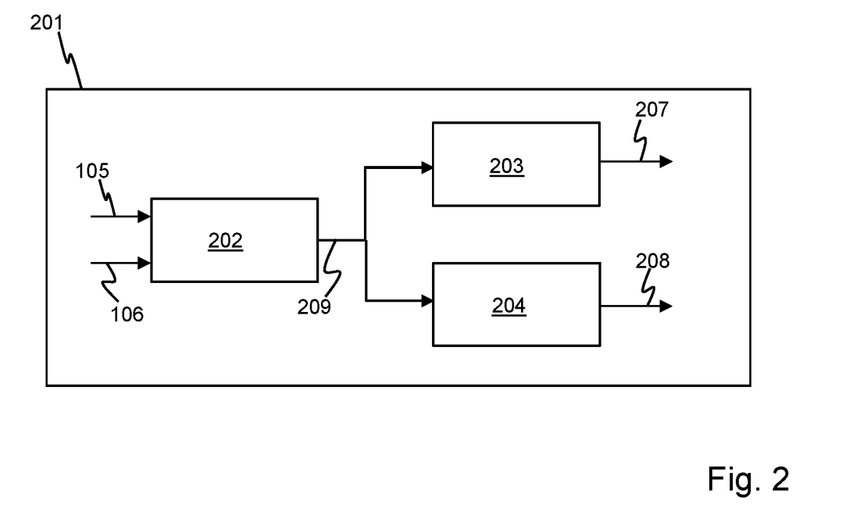
FIG. 2 is a schematic diagram of an example phase comparison module for use in the PLL of FIG. 1.

Jitter of the output signal provided by the VCO 103 may impact the PLL's function and must therefore be supervised in real time. This applies especially for transient jitter spikes caused by SEUs. For second or higher order PLLs, the integrating behaviour of the loop filter 102 combined with the clock feedback ensures that the phase difference of the two comparator input clock signals 105, 106 is very near to zero once the PLL 100 is locked. This near-zero phase difference is a potential condition for metastability of the phase comparison module 101. Conventional state-of-the-art PLL phase comparison modules may therefore contain modules such as synchronizers to prevent or mitigate this potential metastability. Such metastability can, however, be exploited as a way of estimating the amount of jitter. FIG. 2 illustrates an example phase comparison module 201 that may be used in place of the phase comparison module 101 in the PLL 100 shown in FIG. 1. The phase comparison module 201 comprises a phase comparator 202, a synchronizer 203 and a resolution time measurement module 204. An output signal 209 from the phase comparator 202 is provided to both the synchronizer 203, which provides an output signal 207 to the loop filter 103 (FIG. 1) and to the resolution time measurement module 204, which provides an output 208 for jitter estimation. The phase comparator 202 may be a flip-flop, operation of which is described further below.

Flip-flops have a data input and a clock input. With each active clock edge, the data input value is sampled and fed to the flip-flop's output. When the data input changes at the same time as the active clock edge occurs, the flip-flop becomes metastable, meaning that its output is unpredictable for a time interval (typically some nanoseconds). This time interval is termed the metastability resolution time. Metastability is not usually desired and circuits are therefore generally designed to minimise or avoid metastability. In synchronous designs, metastability is avoided by design requirements that keep the input data stable for a minimum time before a clock edge, and for a minimum time after the clock edge. In asynchronous designs, a synchronizer can be used that captures a flip-flop's output after a time that is expected to be nearly always higher than the metastability resolution time. In the first case, a metastability is avoided and in the second case metastability is worked around. Metastability is rarely considered beneficial.

Metastability of flip-flops can lead to oscillations of the flip-flop output. The number of oscillations until a steady state is reached depends on the time difference of the input clock edges. A lower time difference leads to a higher number of oscillations. This is illustrated by Reyneri et al in "Oscillatory Metastability in Homogeneous and Inhomogeneous Flip-Flops", IEEE Journal of Solid-State Circuits, Vol. 25, No. 1, pp. 254-264.

Depending on the flip-flop's properties, metastability may not lead to oscillations, but instead to an increased propagation delay time, which is the metastability resolution time. The propagation delay increases with a lower time difference $\Delta t$ between the clock edges, as disclosed by Bhusan et al, in "CMOS Latch Metastability Characterization at the 65-nm-Technology Node", 2008 IEEE Conference on Microelectronic Test Structures, March 24-27, pp. 147-151.

Factors that influence whether metastability leads to oscillation or to an increased delay time are discussed in the above two references and by Jones et al, in "Synchronizer Behavior and Analysis", 2009 15$^{th}$ IEEE Symposium on Asynchronous Circuits and Systems, pp. 117-126.

Figure 3:
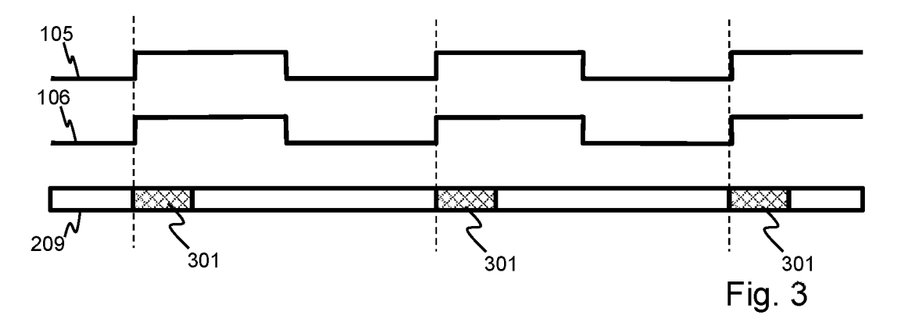
FIGS. 3 and 4 are plots of application and feedback clock signals provided as inputs to a phase comparison module and a resulting metastability in an output of the phase comparison module.
Figure 4:
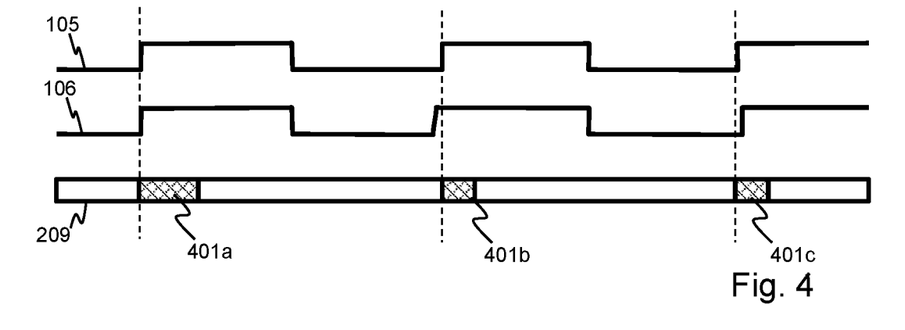
Figure 5:
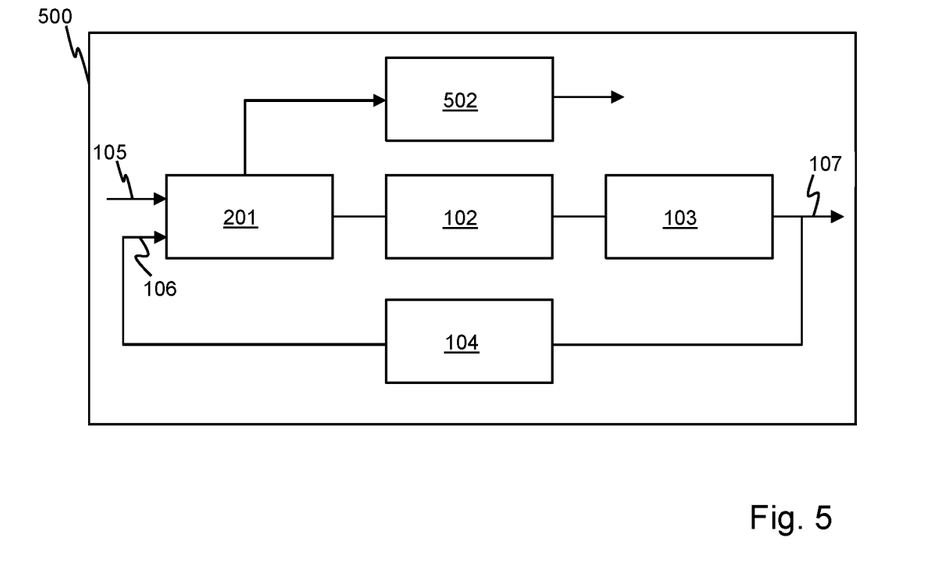
FIG. 5 is a schematic diagram of an example PLL.

Operation of the phase comparison module 201 of FIG. 2 may be explained with reference to the clock signals 105, 106 and the output signal 209 from the flip-flop 202, as illustrated in FIGS. 3 and 4.

FIG. 3 illustrates a sequence of clock signals 105, 106 where the signals are synchronized, i.e. the rising and falling edges of each clock pulse are aligned such that there is no measurable jitter. This results in the output signal 209 of the flip-flop 202 becoming metastable for a short time period after each rising edge of the clock signals 105, 106. The more exact the clock phases match, the longer the time period where the output 209 is metastable, resulting in a longer metastability resolution time. The metastability resolution time of a flip-flop is defined as the time taken for the output of the flip-flop to settle on a definite value after the inputs of the flip-flop change. For the phase comparison module 201 of FIG. 2, the clock synchronizer 203 is used to maintain the intended transfer function. In the example of FIG. 3, after each rising clock pulse the output 209 is metastable for time periods 301, which are the same each time provided the clock signals 105, 106 are synchronized.

FIG. 4 illustrates an example in which there is significant clock jitter, which in this case is demonstrated by the feedback clock signal 106 falling out of synchronization with the input clock signal 105. This results in the metastable resolution time of the output signal 209 of the flip-flop becoming variable. The more the clock signals 105, 106 fall out of synchronization with each other, the shorter the metastable resolution time becomes. As shown in FIG. 4, where the rising edges of the clock signals 105, 106 are aligned, the metastable resolution time 401a is longer, as in the example of FIG. 3. For subsequent rising edges of the clock signals 105, 106, however, the feedback clock signal 106 arrives earlier and then later than the input clock signal 105, resulting in shorter metastable resolution time periods 401b, 401c.

In general therefore, the length of the metastable resolution time period of the flip-flop indicates the degree of jitter in the output clock signal 107 of the PLL, with a longer metastable resolution time period indicating a lower jitter. Measuring the metastable resolution time period of the flip-flop over active clock cycles of the clock signals can therefore provide a measure of jitter of the PLL output clock signal. In a general aspect, measuring the metastable resolution time period may comprise detection of rising and/or falling edges of the clock signals input to the phase comparator.

PLLs can vary in many aspects according to their structure or operating mode. Measuring a metastable resolution time period to determine jitter can work with some types of PLL and with other types if suitably adjusted. PLLs may vary according to the following aspects:

Order of the feedback function (i.e. $1^{st}$ order, $2^{nd}$ order etc.);

Comparator transfer function (binary, i.e. Bang-Bang, or linear);

Oscillator type (analog, as used in standard analog PLLs, or digital, as used in ADPLLs);

Feedback divider: Integer or fractional-N;

Output frequency (constant frequency or chirp).

Table 1 below lists various PLL properties and their suitability for use with a measure of metastability resolution time for determining a measure of jitter.

TABLE 1

PLL Properties and Suitability

| Property | Options | Suitability |
| --- | --- | --- |
| Order of the feedback function | $1^{st}$ | With additional measures |
|  | $2^{nd}$ or higher | Yes |
| Comparator transfer function | binary, i.e. "bang-bang" | Yes |
|  | linear | Yes |
| Oscillator | analog | Yes |
|  | digital | Yes |
| Feedback divider | Integer PLL | Yes |
|  | fractional-N PLL | With additional measures |
| Output frequency | constant frequency | Yes |
|  | chirp | Yes, for $3^{rd}$ order and higher |

There are two options for which the technique described herein does not work unless additional measures are taken: a $1^{st}$ order PLL, and a fractional-N PLL. In both cases a locked PLL will not have clock edges with a time difference near to zero at the phase comparison module. Adding an integrating component to the loop filter of a $1^{st}$ order PLL, however, can ensure $2^{nd}$ order behaviour and make the PLL suitable for the technique. In Fractional-N PLLs, the feedback divider changes between two or more divider ratios, hence the phase difference at the phase comparison module changes between strongly above zero, and strongly below zero. The technique described herein cannot therefore be used. A mitigation can be, however, to switch to integer mode at regular intervals, similar to many other ways of intermittent self-test modes. The feedback divider 104 may therefore operate as a fractional-N divider in a normal operational mode and as an integer divider in a test mode. Depending on the application, the PLL clock may then be still usable (albeit probably with a frequency slightly deviating from the intended frequency), or the PLL clock is not usable at all, and the PLL needs to be treated as any other IP that is temporarily not usable during self-test. The technique therefore works when the PLL is operating with the feedback divider in integer mode.

In chirp mode, the PLL output frequency rises continuously from a minimum to a maximum value for each chirp. This can be achieved either by continuously increasing the feedback divider ratio or by continuously increasing the reference frequency. In both cases, the oscillator control voltage needs to rise steadily. In case of a $3^{rd}$ order (or higher) PLL the integration part of the loop filter will ensure that a near-to-zero time difference of the phase comparison module's input (that is required for the jitter detection) leads to the required ramping oscillator control voltage.

In a bang-bang PLL mode, the phase comparison module delivers only a binary decision on the phase difference. This is the situation shown in FIG. 2. In a linear phase comparison module mode, the phase comparison module outputs a signal that is instead proportional to the phase difference. In ADPLLs this is achieved by using a Time-to-Digital Converter (TDC) in place of the flip-flop 202 in the PLL 201 shown in FIG. 2. The phase comparison module 201 is otherwise similar to that described above. Such a linear phase comparison module can be designed to show metastable behaviour in case of near-to-zero phase difference, where a subsequent synchronizer eliminates the metastability in the signal fed to the loop filter. PLLs with such linear phase comparison modules can therefore also be used with the technique described herein.

The task of the measurement module 204 (FIG. 2) is to measure when the phase comparator's metastable state has ended, i.e. when the comparator output is stable. This task faces two fundamental challenges. Firstly, it is not possible to measure the time needed for a flip-flop to turn from a metastable state to a stable state if both states have the same output value. This can occur in case the metastability leads to increased propagation delay time, but it cannot occur in case the metastable state leads to oscillations of the comparator's flip-flop. The method described herein therefore apply to the case where the flip-flop output state oscillates while the flip-flop is in a metastable state. Secondly, in some (very unlikely) cases, the measurement module itself can turn to a metastable state. A requirement therefore is that the measurement module does not exhibit metastability.

Systems using a metastability recovery time are sometimes used in other applications. Some examples include: sensors for measuring aging (Suresh et al, "Fine grained wearout sensing using metastability resolution time", 15th International Symposium on Quality Electronic Design, Year: 2014), temperature and voltage (Tarawneh, "Solutions and application areas of flip-flop metastability", PhD Thesis, 2013, online: https://theses.ncl.ac.uk/jspui/bitstream/10443/2312/1/Tarawneh%2013.pdf; Tarawneh et al., "Intra-chip physical parameter sensor for FPGAs using Flip-Flop metastability", 22nd International Conference on Field Programmable Logic and Applications (FPL), Year: 2012). Physically Unclonable Functions, i.e. functions that are unique for each IC, but repeatable over long time and insensitive to aging, temperature and supply voltage may also employ metastability recovery time (Kinniment et al., "Design of a random number generator using metastability", Proceedings of the 28th European Solid-State Circuits Conference, Year: 2002; Marchand et al., "Design and Characterization of the TERO PUF on SRAM FPGAs", 2016 IEEE Computer Society Annual Symposium on VLSI). Even in these fields, however, systems using metastability recovery time are a rare exception.

In the case of using metastability for measuring operation of a PLL, the strength is its high sensitivity, while the weakness of low long-term accuracy is less relevant because this is compensated by feedback, without any loss of accuracy.

Although the measure of metastability may have a low absolute accuracy, a useful output may be provided if a time threshold, $T_{offset}$, is used in relation to the metastability resolution time $\Delta t$. The output of the jitter evaluation module may be binary, i.e. a signal indicating whether the time threshold has been reached. An output of the jitter evaluation module may be of the following form:

Output=0 if input edges arrive with $\Delta t < T_{offset}$
Output=1 if input edges arrive with $\Delta t > T_{offset}$ The time threshold may be selected dependent on multiple factors like aging, process corner, supply voltage, temperature, asymmetry of the flip-flop, steepness of the input signal edges. In a general aspect therefore, the measurement module may be configured to detect whether the metastable resolution time of the phase comparator is above a threshold time. If the metastable resolution time is below the threshold, this may correspond to jitter being above a threshold level and if the metastable resolution time is above the threshold this may correspond to jitter being below the threshold level.

If, in a given phase comparator, metastability leads to oscillations or to increased propagation delay time, this mainly depends on the ratio of two characteristic parameters of the comparator. A first parameter is the loop propagation time of the comparator's flip-flop, i.e. the sum of the gate delays of the flip-flop. This depends on the number of gates in the flip-flop. A flip-flop with two gates will not oscillate, whereas flip-flops with four or more gates can show oscillations, depending on the steepness of the input signals. Adding further gates can hence ensure that metastability nearly always causes oscillations. A second parameter is the steepness of the edges at the input. Steeper edges make an oscillating behavior more likely.

For the case of metastability leading to oscillations in the phase comparator, FIG. 4 shows the metastable resolution times 401a-c over which the output will oscillate. A longer resolution time will include a larger number of oscillations. Once method of determining the resolution time therefore is to count the number of oscillations after each clock signal leading edge.

Figure 6:
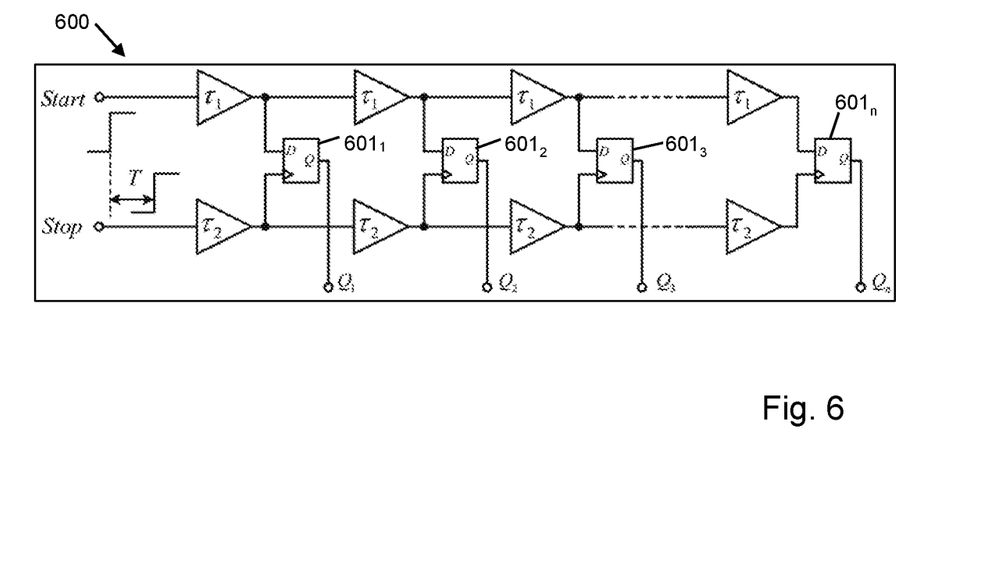
FIG. 6 is a schematic diagram of a circuit for determining a metastable resolution time.

FIG. 6 illustrates an example circuit 600, derived from Suresh et al mentioned above, for determining a metastable resolution time. The circuit is an implementation of a time-to-digital converter, in which the signal is captured sequentially by n different flip-flops $601_{1-n}$, with a time interval between to capture strobes of $\tau_1$-$\tau_2$. Choosing $\tau_1$-$\tau_2$ to be relatively small enables a high temporal resolution. This circuit hence allows sampling a complete process of metastability and recovery from metastability.

Figure 7:
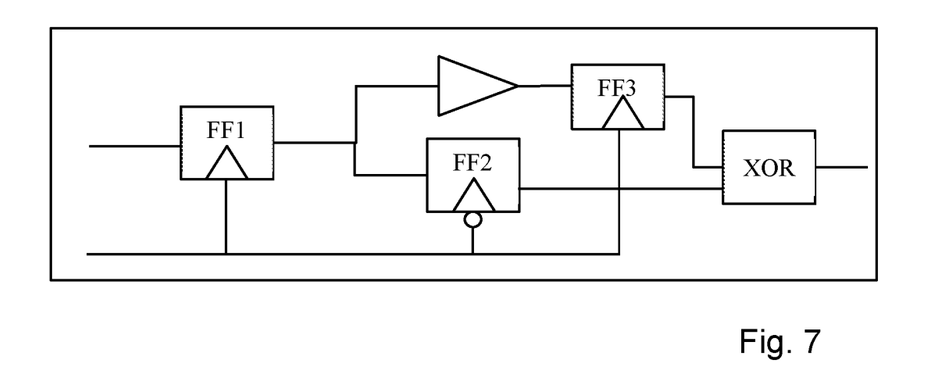
FIG. 7 is a schematic diagram of a circuit for detecting a minimum metastable resolution time.

FIG. 7 illustrates an example circuit 700 designed to detect if a metastability of a minimum duration exists, in which the duration is given by half the clock cycle length minus the buffer delay. The application clock signal 105 is provided to the first flip-flop FF1 in the circuit 700. This circuit can be used when only a decision is needed if metastability recovery occurs after a certain time interval. Further details of this type of circuit are provided in Tarawneh et al, mentioned above.

Figure 8:
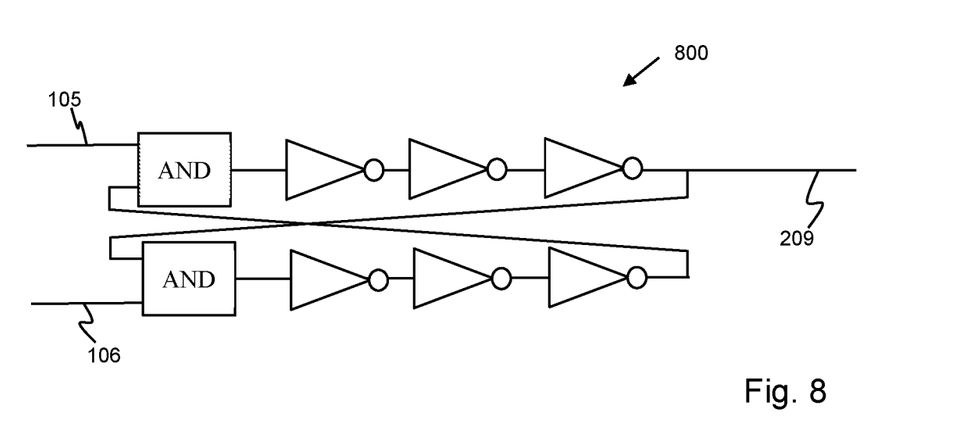
FIG. 8 is a schematic diagram of an example ring oscillator cell.

According to a further example, the phase comparator is not a simple latch or flip-flop but is instead a ring oscillator cell 800, an example of which is shown in FIG. 8. This type of cell is described as a Transient Effect Ring Oscillator by Marchand et al for creating a True Random Number. It has the advantage of much longer metastability resolution times, hence the circuitry to measure the metastability resolution time can be slower, and hence needs less power and less area.

In some implementations, the metastability resolution time may be used to detect if the PLL is locked, since the phase comparator metastability is highest when the PLL has reached lock.

From reading the present disclosure, other variations and modifications will be apparent to the skilled person. Such variations and modifications may involve equivalent and other features which are already known in the art of PLLs, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

What is claimed is:

1. A phase-locked loop, PLL comprising:
   a phase comparison module;
   a loop filter;
   a voltage controller oscillator, VCO;
   a feedback divider; and
   a jitter evaluation module,
   wherein the phase comparison module is configured to receive an application clock signal and a feedback clock signal, the loop filter is configured to receive an output signal from the phase comparison module, the VCO is configured to receive an output signal from the loop filter and provide the output clock signal, and the feedback divider is configured to receive an output clock signal and provide the feedback clock signal to the phase comparison module,
   wherein the phase comparison module comprises a phase comparator and a measurement module configured to detect a metastable output in the phase comparator over active clock cycles of the application and feedback clock signals and provide an output signal to the jitter evaluation module indicating a metastability resolution time for the phase comparator, the jitter evaluation module being configured to provide an output indicative of jitter based on the metastability resolution time, and
   wherein the phase comparator is a flip-flop configured to receive the application and feedback clock signals, the phase comparison module comprising a synchronizer configured to receive an output signal from the flip-flop and provide the output signal from the phase comparison module, the measurement module configured to detect a metastable output in the output signal from the flip-flop.

2. The PLL of claim 1, wherein the measurement module is configured to detect oscillations in the output signal from the flip-flop over active clock cycles of the application and feedback clock signals.

3. The PLL of claim 2, wherein the measurement module is configured to count a number of oscillations in the output signal from the flip-flop over active clock cycles of the application and feedback clock signals.

4. The PLL of claim 1, wherein the measurement module is configured to detect a propagation delay time in the output signal from the flip-flop over active clock cycles of the application and feedback clock signals.

5. The PLL of claim 1, wherein the phase comparator is a time-to-digital converter, TDC, configured to receive the application and feedback clock signals, the phase comparison module comprising a synchronizer configured to receive an output signal from the TDC and provide the output signal from the phase comparator, the measurement module configured to detect a metastable output in the output signal from the TDC.

6. The PLL of claim 1, wherein the PLL is a $2^{nd}$ or higher order PLL.

7. The PLL of claim 1, wherein the feedback divider is configured to operate as an integer divider.

8. The PLL of claim 7, wherein the feedback divider is configured to operate as a fractional-N divider when the PLL is operating in a first operational mode and as an integer divider when the PLL is operating in a second test mode.

9. A method of determining jitter in an output clock signal of a phase-locked loop, PLL comprising a phase comparison module, a loop filter, a voltage controller oscillator, VCO and a feedback divider, wherein the phase comparison module receives an application clock signal and a feedback clock signal, the loop filter receives an output signal from the phase comparison module, the VCO receives an output signal from the loop filter and provides the output clock signal, and the feedback divider receives the output clock signal and provides the feedback clock signal to the phase comparison module, the method comprising detecting a metastable output in a phase comparator of the phase comparison module over active clock cycles of the application and feedback clock signals and providing an output signal indicating a metastability resolution time for the phase comparator, wherein the phase comparator is a flip-flop, the flip-flop receives the application and feedback clock signals and a synchronizer receives an output signal from the flip-flop, the synchronizer provides the output signal from the phase comparison module, wherein the measurement module detects a metastable output in the output signal from the flip-flop.

10. The method of claim 9, wherein the measurement module detects oscillations in the output signal from the flip-flop over active clock cycles of the application and feedback clock signals.

11. The method of claim 10, wherein the measurement module counts a number of oscillations in the output signal from the flip-flop over active clock cycles of the application and feedback clock signals.

12. The method of claim 9, wherein the measurement module detects a propagation delay time in the output signal from the flip-flop over active clock cycles of the application and feedback clock signals.

13. The method of claim 9, wherein the phase comparator is a time-to-digital converter, TDC, that receives the application and feedback clock signals, a synchronizer receives an output signal from the TDC and provides the output signal from the phase comparator, the measurement module detects a metastable output in the output signal from the TDC.

14. A phase-locked loop, PLL comprising:
    a phase comparison module configured to receive an application clock signal and a feedback clock signal, the phase comparison module comprising:
       a phase comparator and a measurement module configured to detect a metastable output in the phase comparator over active clock cycles of the application and feedback clock signals and provide an output signal indicating a metastability resolution time for the phase comparator, and
       a synchronizer configured to receive an output signal from the phase comparator and provide the output signal from the phase comparison module;
    a loop filter configured to receive an output signal from the phase comparison module;
    a voltage controller oscillator, VCO, configured to receive an output signal from the loop filter and provide the output clock signal;

a feedback divider configured to receive an output clock signal and provide the feedback clock signal to the phase comparison module; and a jitter evaluation module configured to provide an output indicative of jitter based on the metastability resolution time.

15. The PLL of claim 14, wherein the phase comparator is a flip-flop configured to receive the application and feedback clock signals, and wherein the measurement module is configured to detect a metastable output in the output signal from the flip-flop.

16. The PLL of claim 15, wherein the measurement module is configured to count a number of oscillations in the output signal from the flip-flop over active clock cycles of the application and feedback clock signals.

17. The PLL of claim 14, wherein the phase comparator is a time-to-digital converter, TDC, configured to receive the application and feedback clock signals, the phase comparison module comprising a synchronizer configured to receive an output signal from the TDC and provide the output signal from the phase comparator, the measurement module configured to detect a metastable output in the output signal from the TDC.

18. The PLL of claim 14, wherein the feedback divider is configured to operate as a fractional-N divider when the PLL is operating in an operational mode and as an integer divider when the PLL is operating in a test mode.

19. A phase-locked loop, PLL comprising:
a phase comparison module;
a loop filter;
a voltage controller oscillator, VCO;
a feedback divider; and
a jitter evaluation module,
wherein the phase comparison module is configured to receive an application clock signal and a feedback clock signal, the loop filter is configured to receive an output signal from the phase comparison module, the VCO is configured to receive an output signal from the loop filter and provide the output clock signal, and the feedback divider is configured to receive an output clock signal and provide the feedback clock signal to the phase comparison module, wherein the phase comparison module comprises a phase comparator and a measurement module configured to detect a metastable output in the phase comparator over active clock cycles of the application and feedback clock signals and provide an output signal to the jitter evaluation module indicating a metastability resolution time for the phase comparator, the jitter evaluation module being configured to provide an output indicative of jitter based on the metastability resolution time, and wherein the phase comparator is a time-to-digital converter, TDC, configured to receive the application and feedback clock signals, the phase comparison module comprising a synchronizer configured to receive an output signal from the TDC and provide the output signal from the phase comparator, the measurement module configured to detect a metastable output in the output signal from the TDC.

20. A method comprising:
determining jitter in an output clock signal of a phase-locked loop, PLL, comprising a phase comparison module, a loop filter, a voltage controller oscillator, VCO, and a feedback divider, wherein the phase comparison module receives an application clock signal and a feedback clock signal, the loop filter receives an output signal from the phase comparison module, the VCO receives an output signal from the loop filter and provides the output clock signal, and the feedback divider receives the output clock signal and provides the feedback clock signal to the phase comparison module; and detecting a metastable output in a phase comparator of the phase comparison module over active clock cycles of the application and feedback clock signals and providing an output signal indicating a metastability resolution time for the phase comparator, wherein the phase comparator is a time-to-digital converter, TDC, that receives the application and feedback clock signals, a synchronizer receives an output signal from the TDC and provides the output signal from the phase comparator, the measurement module detects a metastable output in the output signal from the TDC.

* * * * *